(12) United States Patent
Yamakawa (10) Patent No.: US 10,818,730 B2
(45) Date of Patent: Oct. 27, 2020

(54) SEMICONDUCTOR MEMORY DEVICE

(71) Applicant: TOSHIBA MEMORY CORPORATION, Minato-ku, Tokyo (JP)

(72) Inventor: Koji Yamakawa, Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/285,123

(22) Filed: Feb. 25, 2019

(65) Prior Publication Data
US 2020/0052039 A1   Feb. 13, 2020

(30) Foreign Application Priority Data
Aug. 9, 2018   (JP) .................... 2018-150327

(51) Int. Cl.
*H01L 27/24*   (2006.01)
*H01L 45/00*   (2006.01)

(52) U.S. Cl.
CPC ...... *H01L 27/2481* (2013.01); *H01L 27/2427* (2013.01); *H01L 45/06* (2013.01); *H01L 45/1233* (2013.01); *H01L 45/1253* (2013.01); *H01L 45/144* (2013.01); *H01L 45/165* (2013.01); *H01L 45/1675* (2013.01)

(58) Field of Classification Search
CPC . H01L 27/2481; H01L 27/2427; H01L 45/06; H01L 45/1233; H01L 45/1253; H01L 45/144; H01L 45/165; H01L 45/1675
USPC .......................................................... 257/4
See application file for complete search history.

(56) References Cited

U.S. PATENT DOCUMENTS

| | | | |
|---|---|---|---|
| 7,745,807 B2 | 6/2010 | Chen et al. | |
| 7,943,502 B2 | 5/2011 | Park et al. | |
| 2011/0147692 A1* | 6/2011 | Park | H04L 45/06 257/2 |

FOREIGN PATENT DOCUMENTS

JP   2011-18838 A   1/2011

* cited by examiner

*Primary Examiner* — Tu-Tu V Ho
(74) *Attorney, Agent, or Firm* — Foley & Lardner LLP (57) ABSTRACT

The semiconductor memory device includes: a first electrode and a second electrode disposed opposed to each other in a first direction; a resistance change film that is provided between the first electrode and the second electrode and contains at least one kind of element selected from germanium, antimony, and tellurium; and a first layer that is provided on a side surface of the resistance change film in a second direction intersecting the first direction and contains at least one kind of the element forming the resistance change film and at least one kind of element selected from nitrogen, carbon, boron, and oxygen.

20 Claims, 7 Drawing Sheets

SEMICONDUCTOR MEMORY DEVICE

CROSS-REFERENCE TO RELATED APPLICATIONS

This application is based upon and claims the benefit of Japanese Patent Application No. 2018-150327, filed on Aug. 9, 2018, the entire contents of which are incorporated herein by reference.

BACKGROUND

Field

Embodiments of the present invention relate to a semiconductor memory device.

Description of the Related Art

As a semiconductor memory device for storing large amount of data, resistance-change type semiconductor memory devices that store information by changing resistance values of memory cells are known.

DETAILED DESCRIPTION

A semiconductor memory device according to an embodiment includes: a first electrode and a second electrode opposed to each other in a first direction; a resistance change film provided between the first electrode and the second electrode, the resistance change film containing at least one kind of element selected from germanium, antimony, and tellurium; and a first layer provided on a side surface of the resistance change film in a second direction intersecting the first direction, the first layer containing at least one kind of the element forming the resistance change film and at least one kind of element selected from nitrogen, carbon, boron, and oxygen.

A semiconductor memory device according to another embodiment includes: a first electrode and a second electrode opposed to each other in a first direction; a resistance change film provided between the first electrode and the second electrode, the resistance change film containing at least one kind of element selected from germanium, antimony, and tellurium; and a first layer provided on a surface of the resistance change film in contact with at least one of the first electrode and the second electrode, the first layer containing at least one kind of the element forming the resistance change film and at least one kind of element selected from nitrogen, carbon, boron, and oxygen.

A semiconductor memory device according to still another embodiment includes: a first wiring layer extended in a first direction; a second wiring layer extended in a second direction intersecting the first direction; a third wiring layer extended in the second direction and adjacent to the second wiring layer in the first direction; a first resistance change film provided between the first wiring layer and the second wiring layer, the first resistance change film containing at least one kind of element selected from germanium, tellurium, and antimony; a second resistance change film provided between the first wiring layer and the third wiring layer, the second resistance change film containing at least one kind of element selected from germanium, tellurium, and antimony; a first layer provided on a side surface of the first resistance change film in the first direction, the first layer containing at least one kind of the element forming the first resistance change film and at least one kind of element selected from nitrogen, carbon, boron, and oxygen; and a second layer provided on a side surface of the second resistance change film between the first layer and the second resistance change film, the second layer containing at least one kind of the element forming the second resistance change film and at least one kind of element selected form nitrogen, carbon, boron, and oxygen.

Semiconductor memory devices according to embodiments will be described below in detail by referring to the accompanying drawings. It should be noted that the following embodiments are illustrated merely as examples and are not intended to limit the present invention.

[First Embodiment]

Configuration

Figure 1:
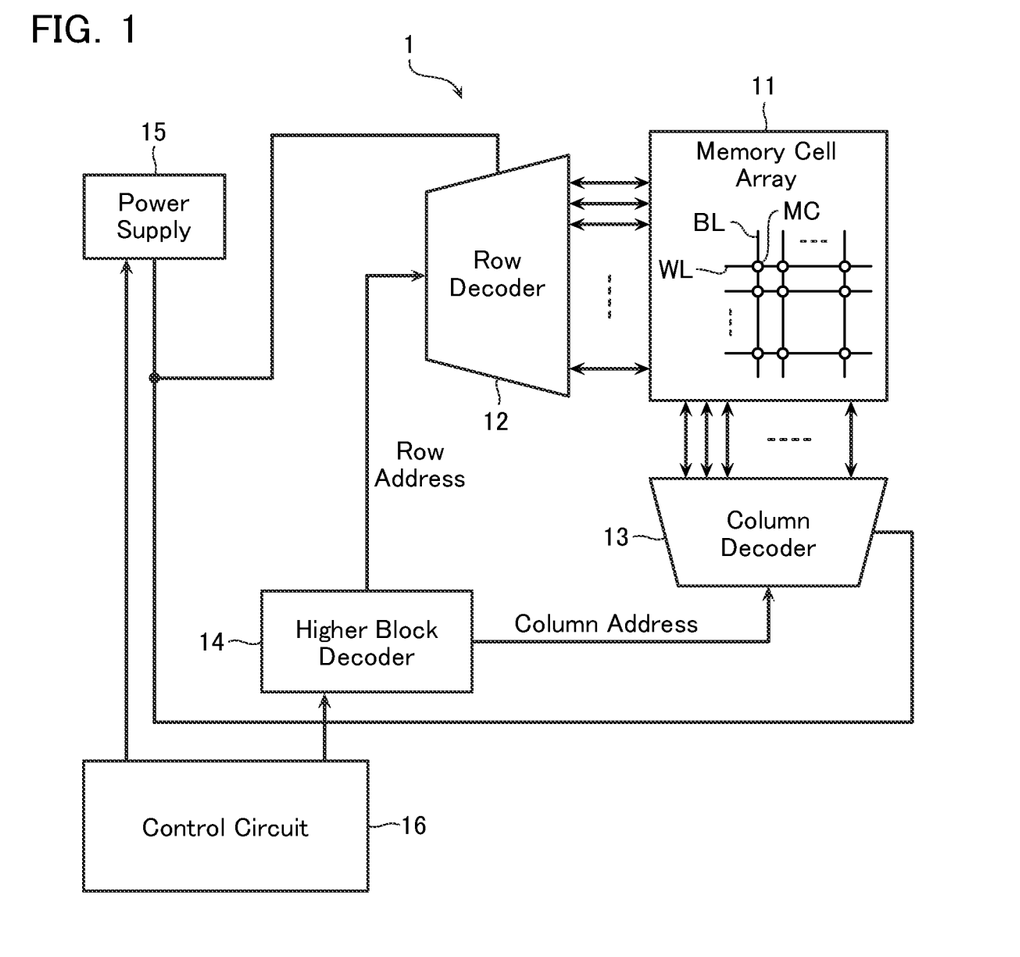
FIG. 1 is a block diagram of a semiconductor memory device according to a first embodiment.

FIG. 1 is a block diagram of the semiconductor memory device according to the first embodiment.

The semiconductor memory device 1 according to the present embodiment includes a memory cell array 11, a row decoder 12 and a column decoder 13 configured to select a desired memory cell MC from the memory cell array 11, a higher block decoder 14 configured to provide row addresses and column addresses to those decoders 12 and 13, a power supply 15 configured to supply power to components of the semiconductor memory device 1, and a control circuit 16 configured to control those components.

The memory cell array 11 includes a plurality of memory cells MC each storing one bit or a plurality of bits of data. The memory cell array 11 is configured to allow a desired memory cell MC to be accessed (to delete/write/read data) by applying a predetermined voltage to a desired bit line BL and word line WL selected by the row decoder 12 and the column decoder 13.

Figure 2:
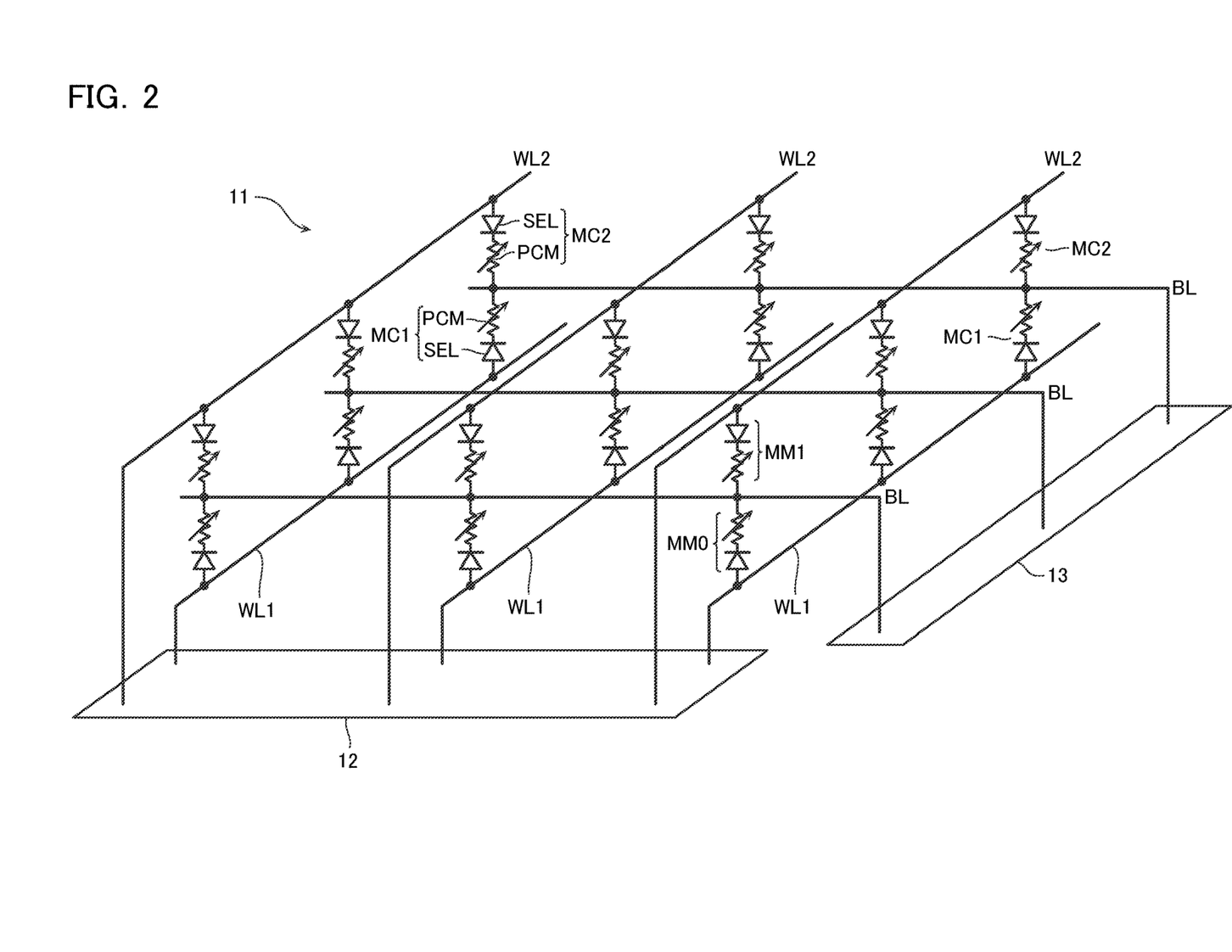
FIG. 2 is a circuit diagram showing a configuration of a memory cell array of the semiconductor memory device.

FIG. 2 is an equivalent circuit diagram showing a configuration of a part of the memory cell array 11.

The memory cell array 11 includes a plurality of bit lines BL, a plurality of word lines WL1, WL2, and a plurality of memory cells MC1, MC2 connected to the bit lines BL and the word lines WL1, WL2.

The memory cells MC1, MC2 are connected to the row decoder 12 via the word lines WL1, WL2, and are also connected to the column decoder 13 via the bit lines BL. Each of the memory cells MC1 and MC2 stores one bit of data, for example. Further, the plurality of memory cells MC1, MC2 connected to the common word lines WL1, WL2 store one page of data, for example.

Each of the memory cells MC1, MC2 is configured with a series circuit of a phase change film PCM and a selector SEL. The phase change film PCM can be in two kinds of states that are a crystalline state with low resistance and an amorphous state with high resistance in response to current patterns (heating patterns), thereby the phase change film PCM functions as a variable resistance element. By associating those two kinds of resistance-value states with information of "0" and "1", the phase change film PCM can be functioned as the memory cell. Further, the selectors SEL of each of the memory cells MC1, MC2 functions as a rectifying element. Accordingly, little current flows through the word lines WL1, WL2 except selected word lines WL1, WL2.

It should be noted that a configuration including the plurality of bit lines BL, the plurality of word lines WL1, and the plurality of memory cells MC1 corresponding to a first layer of the memory cell array 11 will be hereinafter referred to as a memory mat MM0. Similarly, a configuration including the plurality of bit lines BL, the plurality of word lines WL2, and the plurality of memory cells MC2 corresponding to a second layer of the memory cell array 11 will be referred to as a memory mat MM1.

Figure 3:
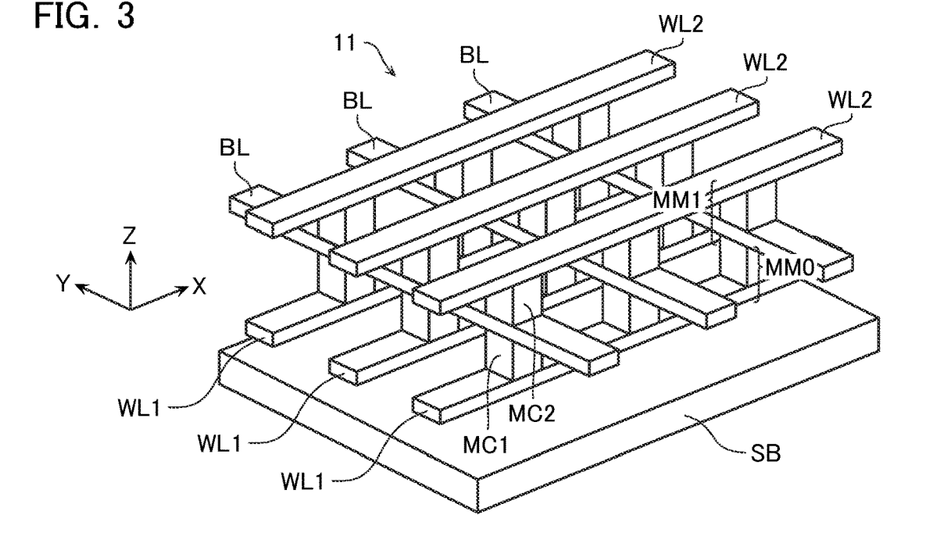
FIG. 3 is a perspective view showing a configuration of the memory cell array.

FIG. 3 is a schematic perspective view showing a configuration of a part of the memory cell array 11.

The memory cell array 11 in this example is a so-called cross-point type memory cell array. That is, above a semiconductor substrate SB, a plurality of word lines WL1 are provided that are disposed at a predetermined distance apart from each other in a Y direction that is parallel to an upper surface of the semiconductor substrate SB and extend in parallel to an X direction that is parallel to the upper surface of the semiconductor substrate SB and intersects the Y direction. Above the plurality of word lines WL1, a plurality of bit lines BL are provided that are disposed at a predetermined distance apart from each other in the X direction and extend in parallel to the Y direction. Further, above the plurality of bit lines BL, a plurality of word lines W2 are provided that are disposed at a predetermined distance from each other in the Y direction and extend in parallel to the X direction. Further, the memory cell MC1 is provided at each of intersections between the plurality of word lines WL1 and the plurality of bit lines BL. Similarly, the memory cell MC2 is provided at each of intersections between the plurality of bit lines BL and the plurality of word lines WL2. It should be noted that while the memory cells MC1, MC2 are rectangular columns in this example, the memory cells MC1, MC2 may be cylindrical.

Figure 4A:
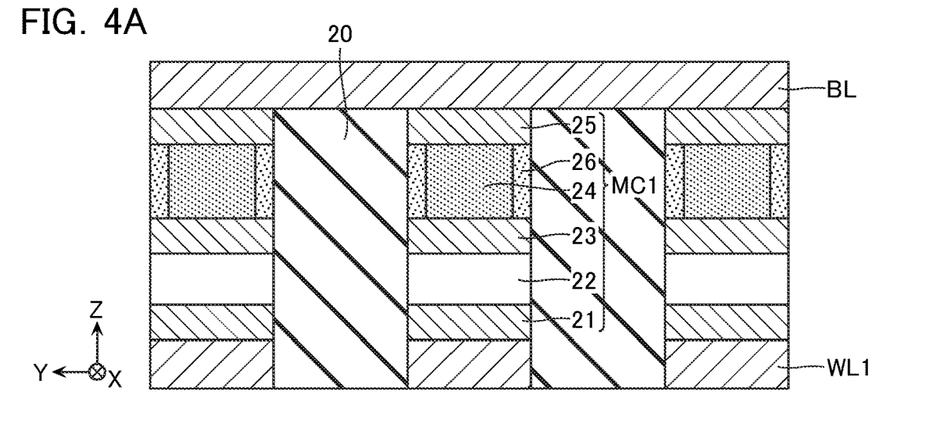
FIGS. 4A and 4B are cross-sectional views showing configurations of a memory mat of the semiconductor memory device.
Figure 4B:
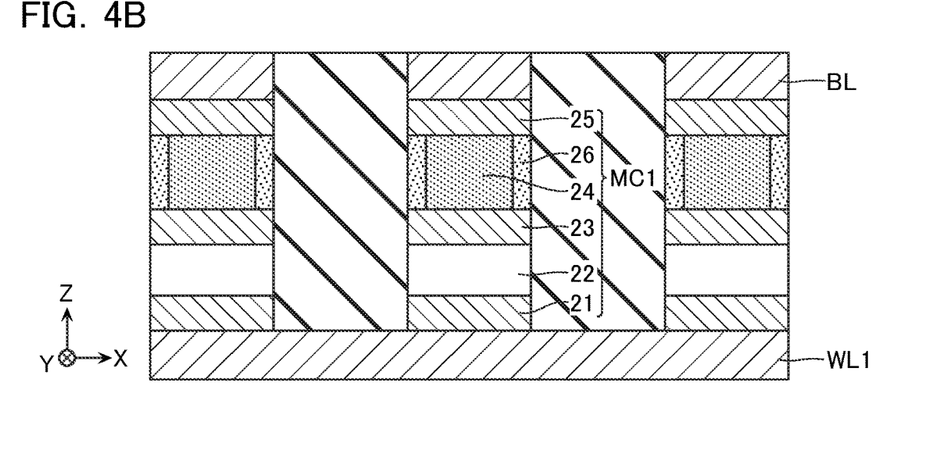

FIGS. 4A and 4B are cross-sectional views showing a configuration of a part of the memory mat MM0. FIG. 4A shows a cross-section orthogonal to the X direction, and FIG. 4B shows a cross-section orthogonal to the Y direction.

The memory mat MM0 includes the word lines WL1 that are disposed closer to the semiconductor substrate SB (not shown) and extend in the X direction, the bit lines BL that are disposed on the side opposite from the semiconductor substrate SB with respect to the word lines WL1 and extend in the Y direction, the memory cells MC1 disposed between the word lines WL1 and the bit lines BL, and an insulating layer 20 provided between side surfaces of the plurality of memory cells MC1 in the XY directions.

The memory cell MC1 is configured with a lower electrode layer 21, a selector layer 22 (selector SEL), an intermediate electrode layer 23 (first electrode), a resistance change film 24, and an upper electrode layer 25 (second electrode) which are stacked in this order in the Z direction (first direction) orthogonal to the X direction and the Y direction from the word line WL1 side toward the bit line BL side. On a side surface of the resistance change film 24 in the XY directions (second direction), a protection layer 26 (first layer) is formed.

The word lines WL1, the bit lines BL, the lower electrode layer 21, the intermediate electrode layer 23, and the upper electrode layer 25 are formed of a conductive material such as tungsten (W), titanium (Ti), polysilicon, or the like, for example. A barrier metal layer may be used for the electrode layers 21, 23, and 25 as necessary. Further, a material having a high thermal resistance effect may be used for the electrode layers 21, 23 and 25 for heating the resistance change film 24. The selector layer 22 is formed of a non-ohmic element such as a pin diode configured with a p-type semiconductor layer, an intrinsic semiconductor layer, and an n-type semiconductor layer, for example. The insulating layer 20 is formed of an insulator such as silicon oxide ($SiO_2$), silicon nitride ($Si_3N_4$), or the like, for example.

The selector layer 22 may be a switching element between two terminals, for example. When a voltage applied between the two terminals is lower than a predetermined threshold value, the switching element is in "high-resistance" state, e.g., an electrically non-conductive state. When a voltage applied between the two terminals is equal to or larger than the predetermined threshold value, the switching element changes to "low-resistance" state, e.g., an electrically conductive state. The switching element may have this function regardless of the polarities of the voltage. The switching element contains at least one kind or more of chalcogens element selected from a group consisting of Te, Se, and S. Also, chalcogenide that is a compound containing the chalcogens elements may be contained. Other than that, the switching element may also contain at least one kind or more of element selected from a group consisting of B, Al, Ga, In, C, Si, Ge, Sn, As, P, and Sb.

The resistance change film 24 contains chalcogens. Chalcogens are elements belonging to group 16 of the periodic table. Among those, the resistance change film 24 contains, for example, sulfur (S), selenium (Se), tellurium (Te), and the like excluding oxygen (O). The resistance change film 24 may also be a chalcogenide film. Chalcogenide is a compound containing chalcogens, for example, such as GeSbTe, GeTe, SbTe, and SiTe. That is, the resistance change film 24 may contain at least one kind of element selected from germanium, antimony, and tellurium.

The protection layer 26 is formed by adding at least one kind of element selected form nitrogen (N), carbon (C), boron (B), and oxygen (O) to a material similar to the material of the resistance change film 24. Further, the protection layer 26 may be formed as a layer containing an element forming the resistance change film 24, for example, at least one kind of element selected from germanium (G), antimony (Sb), and tellurium (Te), and at least one kind of element selected from nitrogen (N), carbon (C), boron (B), and oxygen (O), for example.

The elements such as nitrogen (N), carbon (C), boron (B), and oxygen (O) increase the melting temperature of the protection layer 26. Thus, in the embodiment disclosed by way of example, the melting temperature of the protection layer 26 is higher than the melting temperature of the resistance change film 24, for example. More specifically, the melting temperature of the protection layer 26 is higher than the heat applied to the resistance change film 24 when accessing to the memory cell MC1, and higher than 500° C., for example. Therefore, the protection layer 26 is not melted by the access to the memory cell MC1 and maintains a solidified state. Further, the protection layer 26 maintains a high-resistance amorphous state. Therefore, the crystallization temperature of the protection layer 26 is higher than the melting temperature of the resistance change film 24.

Next, functions of the protection layer 26 and effects of the present embodiment will be described.

The resistance change film 24 is changed to an amorphous state (reset state) by heating to temperature equal to or higher than the melting temperature and rapid cooling. Further, the resistance change film 24 is changed to a crystallized state (set state) by heating to a temperature lower than the melting temperature and higher than the crystallization temperature and gradually cooling. Therefore, the resistance change film 24 repeats melting and solidification by resetting and setting. In the case that there is no protection layer 26, repetition of melting and solidification of the resistance change film 24 may cause voids to be formed in an interface between the resistance change film 24 and the insulating layer 20, may cause monotectoid of constituent elements, and may cause reaction, diffusion, and the like with peripheral members. Those phenomena cause deterioration in phase-change memories.

On the other hand, in the case where the protection layer 26 is formed on the interface between the resistance change film 24 and the insulating layer 20 as in the present embodiment, since the protection layer 26 contains the constituent element of the resistance change film 24, the protection layer 26 has an affinity with the resistance change film 24 so that both are coupled stably. Further, the melting temperature of the protection layer 26 is raised by adding the elements such as N, C, B, and O and keep the solidified amorphous state, so that the phenomena such as generation of the voids, monotectoid, composition change, reaction and diffusion with the insulating layer 20 can be suppressed. Further, since the protection layer 26 keeps the amorphous state, the resistance value of the protection layer 26 is high so that almost no electric current is flown. Therefore, the protection layer 26 does not affect the value of the current flowing between the intermediate electrode layer 23 and the upper electrode layer 25.

Next, a manufacturing method of the semiconductor memory device according to the first embodiment will be described.

Figure 5:
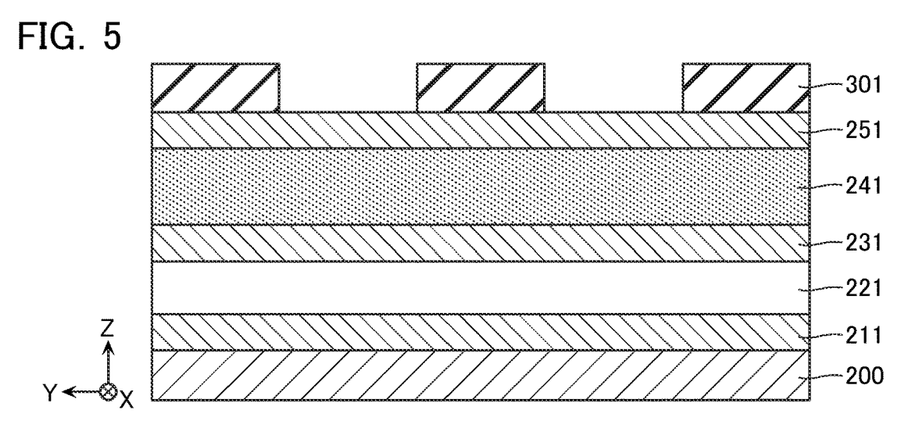
FIG. 5 is a cross-sectional view showing a manufacturing method of the memory mat of the semiconductor memory device.

As shown in FIG. 5, above the semiconductor substrate, not shown, a conductive layer 200 which forms the word lines WL, a conductive layer 211 which forms the lower electrode layer 21, a semiconductor layer 221 which forms the selector layer 22, a conductive layer 231 which forms the intermediate electrode layer 23, a resistance change film 241 which forms the resistance change film 24, and a conductive layer 251 which forms the upper electrode layer 25 are formed in this order by a method such as ALD (Atomic Layer Deposition) or CVD (Chemical Vapor Deposition). Then, a hard mask 301 is formed on the conductive layer 251 by lithography.

Figure 6:
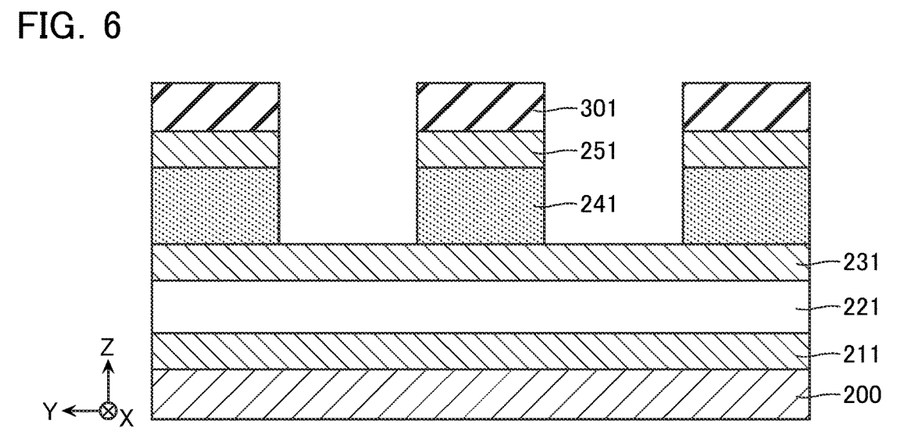
FIG. 6 is a cross-sectional view showing the manufacturing method of the memory mat of the semiconductor memory device.

Then, as shown in FIG. 6, a stacked structure from the conductive layer 251 to the resistance change film 241 is cut to separate in the Y direction by anisotropic etching such as RIE (Reactive Ion Etching), for example, by using the hard mask 301.

Figure 7:
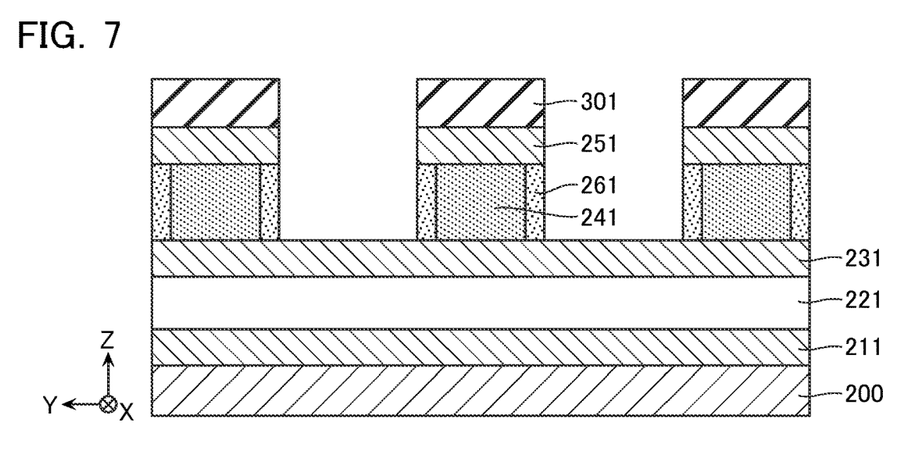
FIG. 7 is a cross-sectional view showing the manufacturing method of the memory mat of the semiconductor memory device.

Then, as shown in FIG. 7, at least one kind of element selected from N, C, B, and O is implanted into side surfaces of the resistance change film 241 in the Y direction by a method such as ion implantation, plasma doping, or annealing after gas injection to form a protection layer 261.

Figure 8:
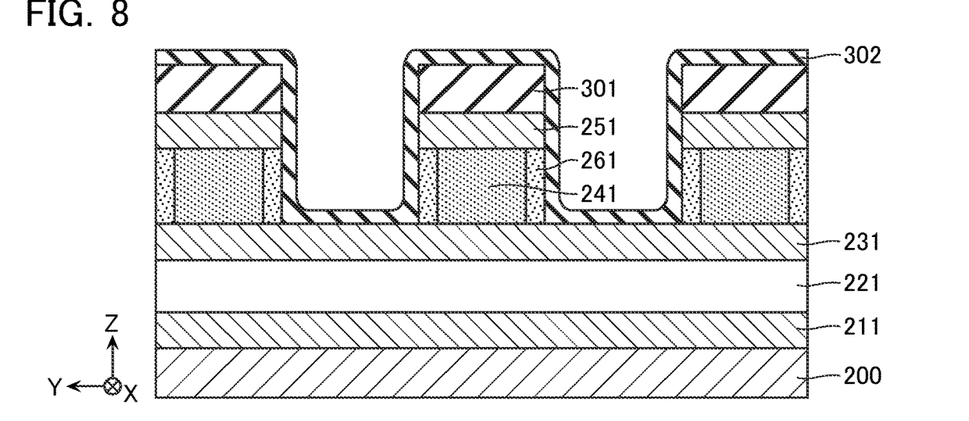
FIG. 8 is a cross-sectional view showing the manufacturing method of the memory mat of the semiconductor memory device.

Subsequently, as shown in FIG. 8, an upper surface of the stacked structure is covered with an insulating film 302 so as to cover the side surfaces of the resistance change film 241. The insulating film 302 is a film for protecting the side surfaces of the resistance change film 241 so as not to be damaged by anisotropy etching performed thereafter.

Figure 9:
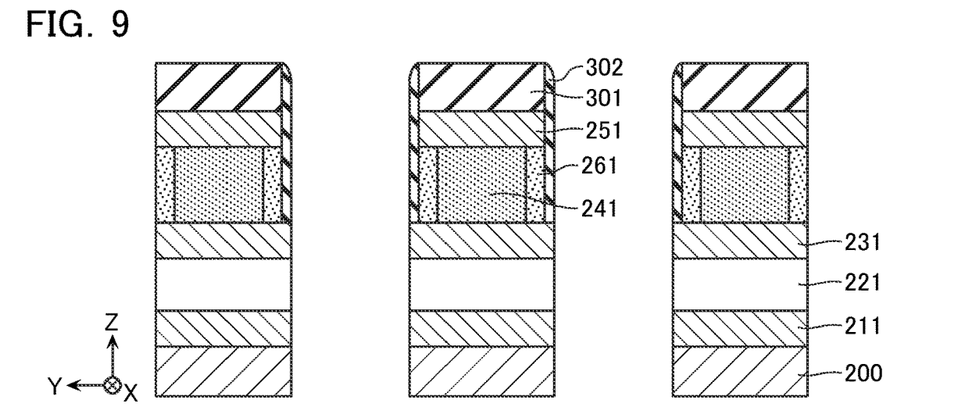
FIG. 9 is a cross-sectional view showing the manufacturing method of the memory mat of the semiconductor memory device.

Next, as shown in FIG. 9, a stacked structure of the conductive layer 231, the semiconductor layer 221, the conductive layer 211, and the conductive layer 200 is cut to separate in the Y direction by anisotropy etching such as RIE using the hard mask 301.

Figure 10:
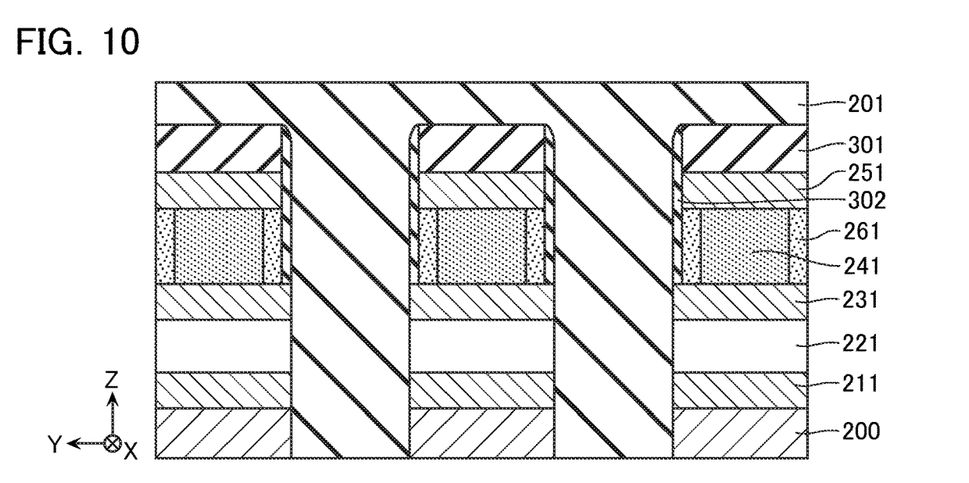
FIG. 10 is a cross-sectional view showing the manufacturing method of the memory mat of the semiconductor memory device.

Then, as shown in FIG. 10, the insulating layer 201 is formed between the stacked bodies separated by the etching, and a top portion of the insulating layer 201 and the hard mask 301 are removed by CMP (Chemical Mechanical Polishing) or the like to expose an upper surface of the conductive layer 251.

Figure 11:
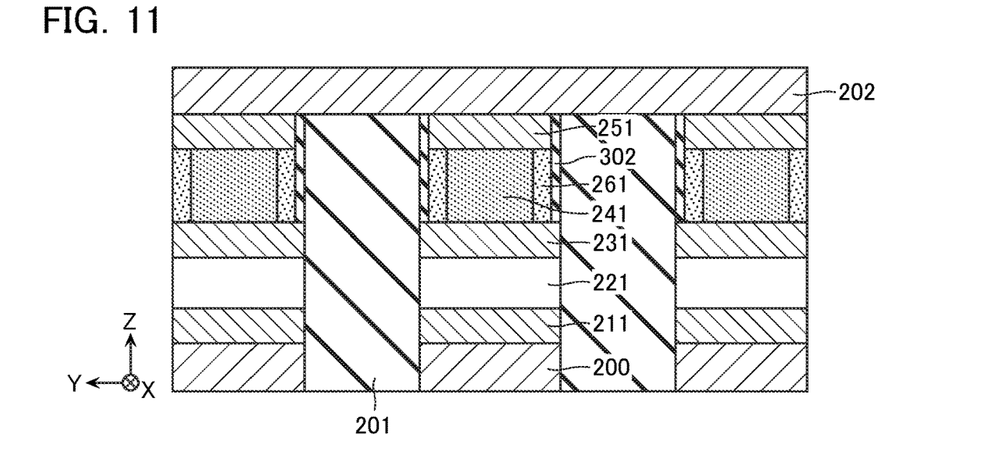
FIG. 11 is a cross-sectional view showing the manufacturing method of the memory mat of the semiconductor memory device.

Subsequently, as shown in FIG. 11, a conductive layer 202 for forming the bit lines BL is formed on the exposed conductive layer 251.

Similar manufacturing steps are repeated for the X direction as well to form the semiconductor memory device shown in FIGS. 4A and 4B.

Note that the protection layer 26 may be formed not only by ion implantation, plasma doping, annealing after gas injection, or the like but may be formed as a sidewall film on the side surfaces of the resistance change film 24. The sidewall film is formed by ALD, CVD, or the like, for example, and contains at least one kind of element selected from chalcogens such as Te and the like, Ge, and Sb and at least one kind of element selected from N, C, B, and O. Further, the protection layer 26 may be formed by solid-phase diffusion after forming the sidewall film described above.

[Second Embodiment]

Figure 12:
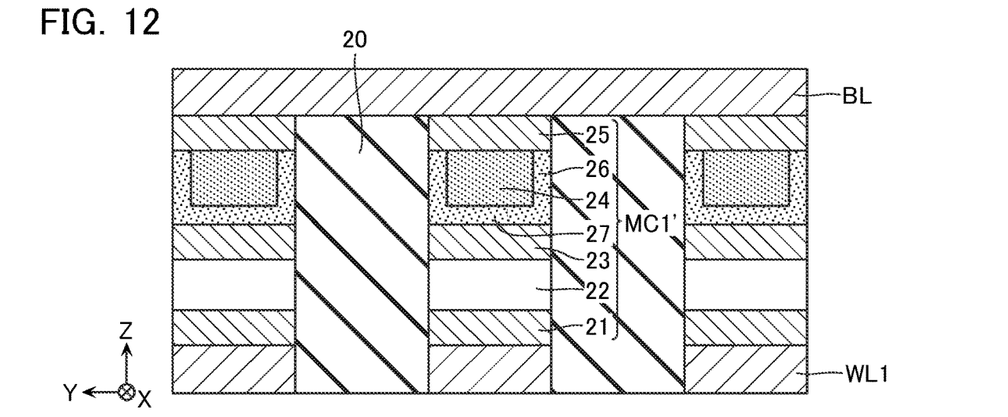
FIG. 12 is a cross-sectional view showing a configuration of a memory mat of a semiconductor memory device according to a second embodiment.

FIG. 12 is a cross-sectional view showing a part of a semiconductor memory device according to a second embodiment.

In the present embodiment, in addition to the protection layer 26 formed on the side surfaces of the resistance change film 24 in the XY directions configuring a memory cell MC1', a protection layer 27 (second layer) is formed also on a surface of the resistance change film 24 on the intermediate electrode layer 23 side. The protection layer 27 is configured as a layer containing similar materials as the materials of the protection layer 26, i.e., at least one kind of element selected from the elements forming the resistance change film 24 such as Ge, Sb, and Te and at least one kind of element selected from N, C, B, and O. The protection layers 26 and 27 are in a solidified amorphous state.

By providing the protection layer 27 between the resistance change film 24 and the intermediate electrode layer 23, it becomes possible to suppress generation of voids, composition change, monotectoid, and the like in the interface between the resistance change film 24 and the intermediate electrode layer 23 caused by melting of the resistance change film 24. Further, by a heat resistance effect of the protection layer 27, the resistance change film 24 can be heated promptly. Since the protection layer 27 is formed much thinner than the resistance change film 24, the resistance value in thickness direction of the protection layer 27 hardly influences the resistance value of the resistance change film 24. Therefore, existence of the protection layer 27 is no hindrance for detecting the resistance change in the resistance change film 24.

The protection layer 27 according to the present embodiment can be formed by implanting at least one kind of element selected from N, C, B, and O to the resistance change film 241 by ion implantation, plasma doping, annealing after gas injection or the like, for example, at the beginning of forming the resistance change film 241 of the first embodiment shown in FIG. 5. Also, the protection layer 27 can be formed by, on the upper surface of the intermediate electrode layer 23, forming a film containing at least one kind of element selected from chalcogens (such as Te), Ge, and Sb and at least one kind of element selected from N, C, B, and O and performing solid-phase diffusion.

[Third Embodiment]

Figure 13:
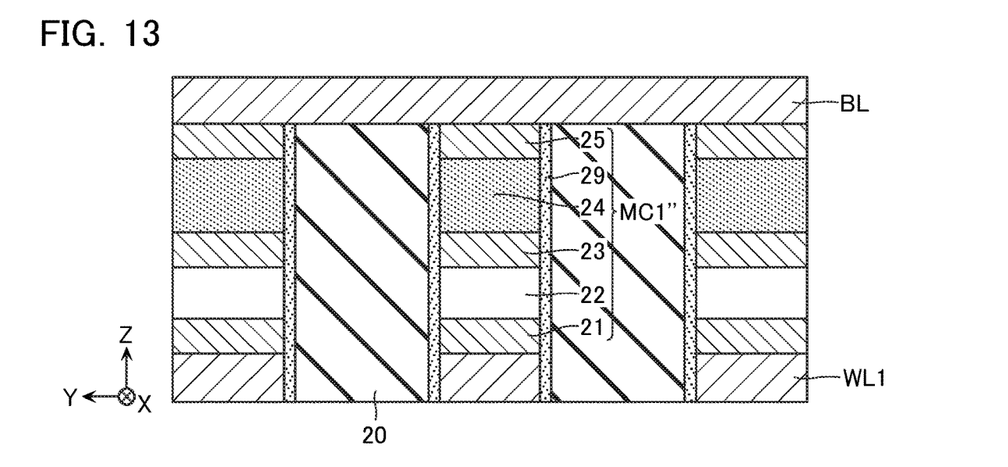
FIG. 13 is a cross-sectional view showing a configuration of a memory mat of a semiconductor memory device according to a third embodiment.

FIG. 13 is a cross-sectional view showing a part of a semiconductor memory device according to a third embodiment.

In the third embodiment, a protection layer 29 is formed on the whole side surfaces of a memory cell MC1" and word lines WL1 in the XY direction. The protection layer 29 contains at least one kind of element selected from chalcogens, Ge, and Sb and at least one kind of element selected from N, C, B, and O.

Next, a manufacturing method of the semiconductor memory device according to the third embodiment will be described.

Same as in FIG. 5, above a semiconductor substrate, not shown, a conductive layer 200 which forms the word lines WL, a conductive layer 211 which forms the lower electrode layer 21, a semiconductor layer 221 which forms a selector layer 22, a conductive layer 231 which forms g the intermediate electrode layer 23, a resistance change film 241 which forms the resistance change film 24, and a conductive layer 251 which forms the upper electrode layer 25 are formed in order. Thereafter, a hard mask 301 is formed on the conductive layer 251. A stacked structure of the conductive layer 251, the resistance change film 241, the conductive layer 231, the semiconductor layer 221, the conductive layer 211, and the conductive layer 200 is cut to separate in the Y direction by anisotropy etching such as RIE using the hard mask 301.

Subsequently, the protection layer 29 is formed on the side surfaces of the separated stacked structures and, further, the insulating layer 201 is formed between the stacked structures. Then, the top portion of the insulating layer 201 and the hard mask 301 are removed by CMP or the like to expose the upper surface of the conductive layer 251, and the conductive layer 202 to form the bit lines BL is formed on the exposed conductive layer 251.

Similar manufacturing steps are repeated for the X direction as well to form the semiconductor memory device shown in FIG. 13.

[Fourth Embodiment]

Figure 14:
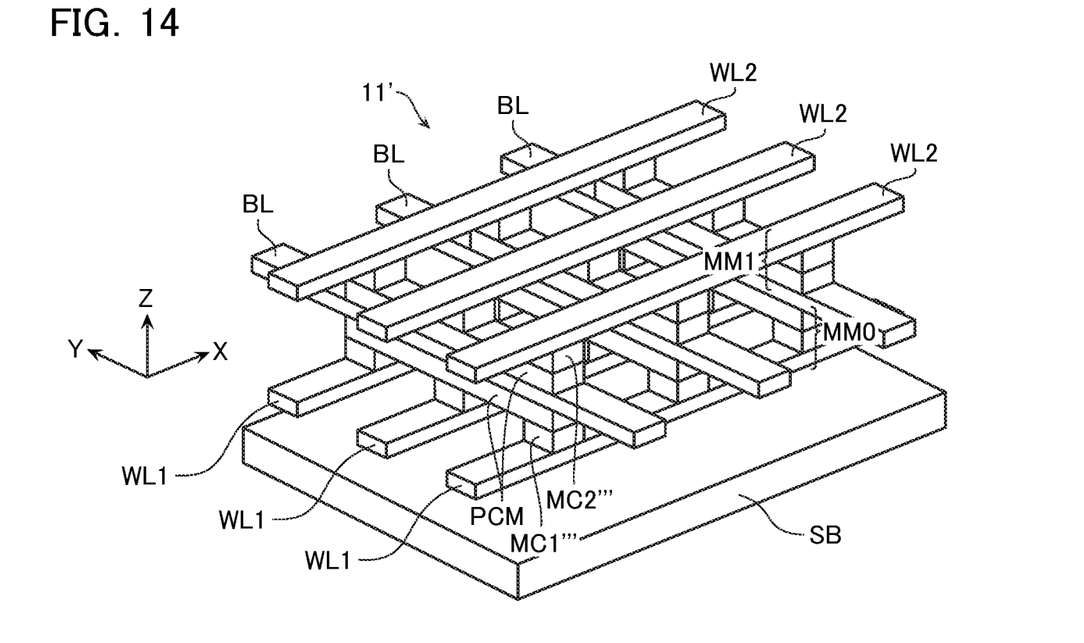
FIG. 14 is a perspective view showing a configuration of a memory cell array of a semiconductor memory device according to a fourth embodiment.

FIG. 14 is a schematic perspective view showing a configuration of a part of a memory cell array 11' of a semiconductor memory device according to a fourth embodiment. In the memory cell array 11' according to the present embodiment, phase change films PCM configuring memory cells MC1''' and MC2''' extend in the Y direction along the upper and lower surfaces of the bit lines BL.

In such memory cell array 11', the protection layer 26 may be formed on only the side surfaces of the phase change film PCM in the X direction.

While certain embodiments have been described, these embodiments have been presented by way of example only, and, are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first electrode and a second electrode opposed to each other in a first direction;
   a resistance change film provided between the first electrode and the second electrode, the resistance change film containing at least one kind of element selected from germanium, antimony, and tellurium;
   an insulating layer in contact with the first electrode and the second electrode; and
   a first layer provided between the resistance change film and the insulating layer, the first layer containing at least one kind of the element forming the resistance change film and at least one kind of element selected from nitrogen, carbon, boron, and oxygen.

2. The semiconductor memory device according to claim 1, wherein the first layer contains at least one kind of element selected from chalcogens, germanium, and antimony and at least one kind of element selected from nitrogen, carbon, boron, and oxygen.

3. The semiconductor memory device according to claim 1, wherein the resistance change film is a chalcogenide film.

4. The semiconductor memory device according to claim 1, wherein the resistance change film is a phase change film.

5. The semiconductor memory device according to claim 4, wherein the first layer contains at least one kind of element forming the phase change film, and is in a solidified amorphous state regardless of a state of the phase change film.

6. The semiconductor memory device according to claim 1, further comprising a second layer on a surface of the resistance change film in contact with at least one of the first electrode and the second electrode.

7. The semiconductor memory device according to claim 6, wherein the resistance change film is a chalcogenide film, and the second layer contains at least one kind of element forming the chalcogenide film and at least one kind of element selected form nitrogen, carbon, boron, and oxygen.

8. The semiconductor memory device according to claim 6, wherein the resistance change film is a phase change film, and the second layer contains at least one kind of element forming the phase change film, and is in a solidified amorphous state regardless of a state of the phase change film.

9. The semiconductor memory device according to claim 1, wherein the insulating layer provided on a side surface of the first layer in a second direction intersecting the first direction.

10. The semiconductor memory device according to claim 1, further comprising a selector provided in the first direction with respect to the resistance change film via the first electrode or the second electrode.

11. A semiconductor memory device comprising:
a first electrode and a second electrode opposed to each other in a first direction;
a resistance change film provided between the first electrode and the second electrode, the resistance change film containing at least one kind of element selected from germanium, antimony, and tellurium;
an insulating layer in contact with the first electrode and the second electrode; and
a first layer provided between the resistance change film and the insulating layer and on a surface of the resistance change film in contact with at least one of the first electrode and the second electrode, the first layer containing at least one kind of the element forming the resistance change film and at least one kind of element selected from nitrogen, carbon, boron, and oxygen.

12. The semiconductor memory device according to claim 11, wherein the first layer contains at least one kind of element selected from chalcogens, germanium, and antimony and at least one kind of element selected from nitrogen, carbon, boron, and oxygen.

13. The semiconductor memory device according to claim 11, wherein the resistance change film is a chalcogenide film.

14. The semiconductor memory device according to claim 11, wherein the resistance change film is a phase change film.

15. The semiconductor memory device according to claim 14, wherein the first layer contains at least one kind of element forming the phase change film, and is in a solidified amorphous state regardless of a state of the phase change film.

16. A semiconductor memory device comprising:
a first wiring layer extended in a first direction;
a second wiring layer extended in a second direction intersecting the first direction;
a third wiring layer extended in the second direction and adjacent to the second wiring layer in the first direction;
a first resistance change film provided between the first wiring layer and the second wiring layer, the first resistance change film containing at least one kind of element selected from germanium, tellurium, and antimony;
a second resistance change film provided between the first wiring layer and the third wiring layer, the second resistance change film containing at least one kind of element selected from germanium, tellurium, and antimony;
a first layer provided on a side surface of the first resistance change film in the first direction, the first layer containing at least one kind of the element forming the first resistance change film and at least one kind of element selected from nitrogen, carbon, boron, and oxygen; and
a second layer provided on a side surface of the second resistance change film between the first layer and the second resistance change film, the second layer containing at least one kind of the element forming the second resistance change film and at least one kind of element selected form nitrogen, carbon, boron, and oxygen.

17. The semiconductor memory device according to claim 16, further comprising a first insulating layer provided between the first layer and the second layer.

18. The semiconductor memory device according to claim 16, comprising:
a fourth wiring layer extended in the first direction and adjacent to the first wiring layer in the second direction;
a third resistance change film provided between the fourth wiring layer and the second wiring layer, the third resistance change film containing at least one kind of element selected from germanium, tellurium, and antimony;
a third layer provided on a side surface of the first resistance change film in the second direction, the third layer containing at least one kind of the element forming the first resistance change film and at least one kind of element selected from nitrogen, carbon, boron, and oxygen; and
a fourth layer provided on a side surface of the third resistance change film between the third layer and the third resistance change film, the fourth layer containing at least one kind of the element forming the third resistance change film and at least one kind of element selected form nitrogen, carbon, boron, and oxygen.

19. The semiconductor memory device according to claim 18, further comprising a second insulating layer provided between the third layer and the fourth layer.

20. The semiconductor memory device according to claim 16, comprising:
a first selector provided between the first resistance change film and the first wiring layer; and
a second selector provided between the second resistance change film and the first wiring layer.

* * * * *